(12) United States Patent
Li et al.

(10) Patent No.: US 12,266,417 B2
(45) Date of Patent: Apr. 1, 2025

(54) STORAGE ARRAY, AND INTERCONNECTION STRUCTURE AND METHOD FOR OPERATING THEREOF

(71) Applicant: ZHEJIANG HIKSTOR TECHNOLOGY CO., LTD., Zhejiang (CN)

(72) Inventors: Kunkun Li, Zhejiang (CN); Shikun He, Zhejiang (CN)

(73) Assignee: ZHEJIANG HIKSTOR TECHNOLOGY CO., LTD., Hangzhou (CN)

( * ) Notice: Subject to any disclaimer, the term of this patent is extended or adjusted under 35 U.S.C. 154(b) by 0 days.

(21) Appl. No.: 18/729,153

(22) PCT Filed: Mar. 10, 2023

(86) PCT No.: PCT/CN2023/080803
§ 371 (c)(1),
(2) Date: Jul. 15, 2024

(87) PCT Pub. No.: WO2024/040926
PCT Pub. Date: Feb. 29, 2024

(65) Prior Publication Data
US 2025/0006228 A1    Jan. 2, 2025

(30) Foreign Application Priority Data
Aug. 22, 2022 (CN) .......................... 202211011155.6

(51) Int. Cl.
*G11C 11/16* (2006.01)
*G11C 5/06* (2006.01)
*G11C 5/08* (2006.01)

(52) U.S. Cl.
CPC ................ *G11C 5/063* (2013.01); *G11C 5/08* (2013.01); *G11C 11/1673* (2013.01); *G11C 11/1675* (2013.01)

(58) Field of Classification Search
CPC ... G11C 11/1673; G11C 11/1675; G11C 5/08; G11C 5/063
See application file for complete search history.

(56) References Cited

U.S. PATENT DOCUMENTS 5,305,265 A * 4/1994 Sugibayashi .......... G11C 29/88
365/194
5,554,874 A   9/1996 Doluca
(Continued)

FOREIGN PATENT DOCUMENTS

CN   102655026 A   9/2012
CN   103227174 A   7/2013
(Continued)

*Primary Examiner* — Sung Il Cho
(74) *Attorney, Agent, or Firm* — The Sun IP Law

(57) ABSTRACT

The present disclosure provides a storage array, and an interconnection structure and a method for operating thereof. The storage array includes: storage units and transistors located in each column and each row, each transistor having a first source/drain and a second source/drain; wherein, a storage unit in an odd-numbered column connected to a first bit line and a second source line; the first source/drain of a transistor in an odd-numbered column is connected to a first source line; the second source/drain of a transistor in an odd-numbered column is connected to a second source line; a storage unit in an even-numbered column connected to a second bit line and a first source line; the first source/drain of a transistor in an even-numbered column is connected to a second source line; and the second source/drain of a transistor in an even-numbered column is connected to a first source line.

13 Claims, 14 Drawing Sheets

(56) References Cited

U.S. PATENT DOCUMENTS

2003/0081453 A1\* 5/2003 Hidaka ............... G11C 11/1655
  365/158
2017/0117042 A1\* 4/2017 Lee ....................... G11C 11/161
2020/0168264 A1\* 5/2020 Endoh ................ G11C 13/0069

FOREIGN PATENT DOCUMENTS

| CN | 110739012 A | 1/2020 |
| CN | 113555046 A | 10/2021 |

\* cited by examiner (a)

(b)

(a)

(b)

(a)

(b)

(a)

(b)

(a)

(b)

(a)

(b)

(a)

(b)

(a)

(b)

STORAGE ARRAY, AND INTERCONNECTION STRUCTURE AND METHOD FOR OPERATING THEREOF

CROSS-REFERENCE TO RELATED APPLICATION

The present disclosure claims the priority of Chinese Patent Application No. 202211011155.6, filed with the China National Intellectual Property Administration on Aug. 22, 2022 and entitled "Storage Array, and Interconnection Structure and Method for Operating Thereof", which is incorporated herein by reference in its entirety.

TECHNICAL FIELD

The present disclosure relates to the field of memory technologies, and in particular, to a storage array, and an interconnection structure and a method for operating thereof.

BACKGROUND

Magnetoresistive Random Access Memory (MRAM) is a memory of which storage units store information using magnetic states. By a certain MRAM, a nonvolatile memory can be stored and units can be written multiple times during the service life of the memory.

In order to realize the switch of high and low resistance states of an MRAM, a 1T1R structure is generally formed by a storage unit and a transistor, and by changing the current direction of the transistor, the storage unit can be written into a low resistance state or a high resistance state.

In a conventional 1T1R-MRAM storage device, the width of a transistor must be made large enough to ensure a power supply capability. A transistor with a double finger structure is a universal implementation for achieving a large power supply capability. However, an existing MRAM read/write circuit with a double finger 1T1R structure has the following technical defect: when the transistor provides a large power supply capability, the unit area of the transistor is increased, thereby limiting the storage unit density of the MRAM.

SUMMARY

In one aspect, the present disclosure provides a storage array, including:
- a plurality of bit lines, two bit lines being arranged in one row, and including a first bit line and a second bit line;
- a plurality of source lines, two source lines being arranged in one row, and including a first source line and a second source line; and
- storage units and transistors located in each column and each row, each transistor having a first source/drain and a second source/drain;
- wherein for any row of the storage array, there are the following connection relationships:
- a storage unit in an odd-numbered column has one end connected to the first bit line, and the other end connected to the second source line;
- the first source/drain of a transistor in an odd-numbered column is connected to the first source line;
- the second source/drain of a transistor in an odd-numbered column is connected to the second source line;
- a storage unit in an even-numbered column has one end connected to the second bit line, and the other end connected to the first source line;
- the first source/drain of a transistor in an even-numbered column is connected to the second source line; and
- the second source/drain of a transistor in an even-numbered column is connected to the first source line.

In some embodiments, the storage array further includes a plurality of word lines, and gates of the transistors in each column are connected to a corresponding word line.

In some embodiments, the storage unit is any type of storage unit among MRAM, PCRAM, RRAM and FRAM.

In another aspect, the present disclosure provides an interconnection structure of a storage array, including:
- a plurality of active areas, wherein each active area corresponds to one row of the storage array and is used for forming sources/drains of transistors in one row;
- a plurality of word lines spanning each active area, wherein each word line corresponds to one column of the storage array, and the plurality of word lines separate each active area;
- storage units located at intervals between the plurality of word lines, wherein one end of a storage unit in an odd-numbered column is connected to an active area between a word line in an odd-numbered column and a word line in a subsequent even-numbered column, and one end of a storage unit in an even-numbered column is connected to an active area between a word line in an even-numbered column and a word line in a subsequent odd-numbered column;
- and a first bit line, a second bit line, a first source line and a second source line located in each active area,
- wherein the first bit line is connected to the other end of a storage unit in an odd-numbered column;
- the second bit line is connected to the other end of a storage unit in an even-numbered column;
- the first source line is connected to an active area between a word line in an even-numbered column and a word line in a subsequent odd-numbered column; and
- the second source line is connected to an active area between a word line in an odd-numbered column and a word line in a subsequent even-numbered column.

In some embodiments, the first bit line, the second bit line, the first source line and the second source line are all located above each active area, and are arranged in parallel in an extending direction of the word lines, and there is no overlapping region in a vertical direction.

In some embodiments, the first source line and the second source line are located in a peripheral region of each active area;
alternatively, the first source line and the second source line are located in a central area of each active area;
alternatively, one of the first source line and the second source line is located in a central area of each active area, and the other is located in a peripheral area of each active area.

In some embodiments, the storage units are located above each active area; and
the storage units are located on contacts, or in any layer of vias.

In some embodiments, the first source line and the second source line include one or more layers of metal lines.

In some embodiments, the first bit line and the first source line are arranged vertically, and there is an overlapping region in a vertical direction; and
the second bit line and the second source line are arranged vertically, and there is an overlapping region in a vertical direction.

In some embodiments, the first bit line is located above the first source line, the first bit line is led out to be above a shallow trench isolation between the active areas by means of staggered arrangement of metal wirings, the second bit line is located above the second source line, and the second bit line is led out to be above a shallow trench isolation between the active areas by means of staggered arrangement of metal wirings;

alternatively, the first source line is located above the first bit line, the first source line is led out to be above a shallow trench isolation between the active areas by means of staggered arrangement of metal wirings, the second source line is located above the second bit line, and the second source line is led out to be above a shallow trench isolation between the active areas by means of staggered arrangement of metal wirings.

In some embodiments, the storage units are located above each active area, or are led out by metal wirings to be above a shallow trench isolation between the active areas;

the storage units are located on contacts, or in any layer of vias; and the storage units in odd-numbered columns and the storage units in even-numbered columns are located on the same plane, or located on different planes.

In some embodiments, the first source line and the second source line include one or more layers of metal lines.

In another aspect, the present disclosure provides a method for operating a storage array, wherein the method includes:

when a read/write operation is performed on a storage unit in an odd-numbered column in any row, a word line adjacent to the selected storage unit in an odd-numbered column is enabled, a control potential is applied to a first bit line and a first source line, transistors corresponding to remaining word lines are turned off, and a second bit line and a second source line are kept floating at the same time; 0 or a negative voltage is applied to bit lines and source lines in other rows or bit lines and source lines in other rows are floating, and 0 is applied to word lines;

when a read/write operation is performed on a storage unit in an even-numbered column in any row, a word line adjacent to the selected storage unit in an even-numbered column is enabled, a control potential is applied to a second bit line and a second source line, transistors corresponding to remaining word lines are turned off, and a first bit line and a first source line are kept floating at the same time; and 0 or a negative voltage is applied to bit lines and source lines in other rows or bit lines and source lines in other rows are floating, and 0 is applied to word lines.

DETAILED DESCRIPTION OF THE EMBODIMENTS

Figure 1:
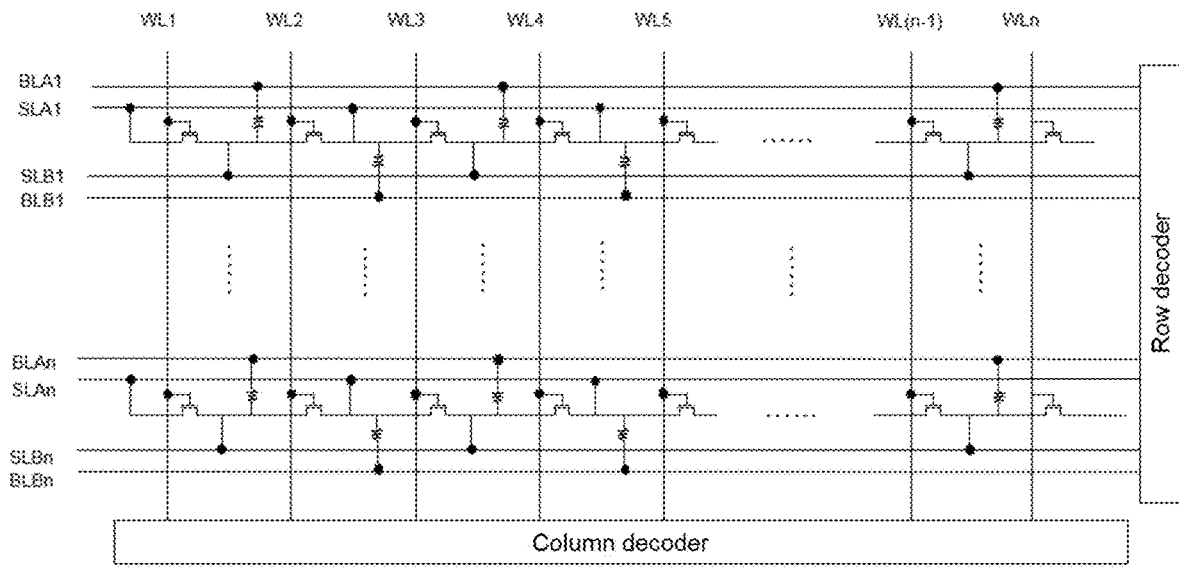
FIG. 1 is a schematic diagram of a circuit structure of a storage array according to an embodiment of the present disclosure.

To make the objectives, technical solutions, and advantages of the embodiments of the present disclosure clearer, the following clearly and completely describes the technical solutions in the embodiments of the present disclosure with reference to the drawings in the embodiments of the present disclosure. Apparently, the described embodiments are merely some rather than all of the embodiments of the present disclosure. All other embodiments obtained by a person of ordinary skill in the art based on the embodiments of the present disclosure without inventive efforts shall belong to the scope of protection of the present disclosure.

It should be noted that, terms such as "first" and "second" in the description and the claims of the present disclosure and the described drawings are used to distinguish similar objects, but are not necessarily used to describe a specific sequence or order. It should be understood that the data used in this way may be interchanged where appropriate for the embodiments of the present application described herein. In addition, the terms "include" and "have", and any variations thereof, are intended to cover a non-exclusive inclusion, for example, a process, method, system, product, or apparatus that includes a series of steps or units is not necessarily limited to those steps or units that are expressly listed, but may include other steps or units that are not expressly listed or inherent to such process, method, product, or apparatus.

In the present disclosure, orientation or positional relationships indicated by the terms such as "up", "down", "left", "right", "front", "rear", "top", "bottom", "inner", "outer", "middle", "vertical", "horizontal", "transverse" and "longitudinal" are orientation or position relationships based on those illustrated in the drawings. These terms are used mainly to better describe the present disclosure and the embodiments thereof, and are not intended to limit that the indicated device, element, or component must have a particular orientation, or be constructed and operated in a particular orientation.

Furthermore, the terms may be used to indicate an orientation or positional relationship, and may also be used to indicate other meanings, for example, the term "on" may also be used to indicate a certain attachment relationship or connection relationship in some cases. The specific meanings of these terms in the present disclosure can be understood by those skilled in the art according to specific situations.

The following describes some embodiments of the present disclosure in detail with reference to the drawings. Without conflict, the following embodiments and features in the embodiments may be combined with each other.

An embodiment of the present disclosure provides a storage array. As shown in FIG. 1, the storage array includes:
a plurality of bit lines, two bit lines being arranged in one row, and including a first bit line and a second bit line;
a plurality of source lines, two source lines being arranged in one row, and including a first source line and a second source line; and
storage units and transistors located in each column and each row, each transistor having a first source/drain and a second source/drain;
the rows of the storage array have the same structure, wherein for any row of the storage array, there are the following connection relationships:
a storage unit in an odd-numbered column has one end connected to the first bit line, and the other end connected to the second source line;
the first source/drain of a transistor in an odd-numbered column is connected to the first source line;
the second source/drain of a transistor in an odd-numbered column is connected to the second source line;
a storage unit in an even-numbered column has one end connected to the second bit line, and the other end connected to the first source line;
the first source/drain of a transistor in an even-numbered column is connected to the second source line; and
the second source/drain of a transistor in an even-numbered column is connected to the first source line.

Further, the storage array further includes a plurality of word lines, and gates of the transistors in each column are connected to a corresponding word line.

In this embodiment, the storage array is arranged transversely as a row and longitudinally as a column. BLs and SLs in the transverse direction are connected to a row decoder; and WLs in the longitudinal direction are connected to a column decoder.

It should be noted that the storage array in the embodiments of the present disclosure can be applied to various types of memories, and the type of the storage unit may be any type of storage unit among MRAM, PCRAM, RRAM and FRAM.

In the storage array provided by the embodiments of the present disclosure, a storage unit in an odd-numbered column in each row, a transistor in an odd-numbered column in the same column, and a transistor in an even-numbered column in a subsequent column constitute a basic operation unit; a storage unit in an even-numbered column in each row, a transistor in an even-numbered column in the same column, and a transistor in an odd-numbered column in a subsequent column constitute a basic operation unit; and the two basic operation units further constitute a minimum repeating unit of the storage array.

Figure 2:
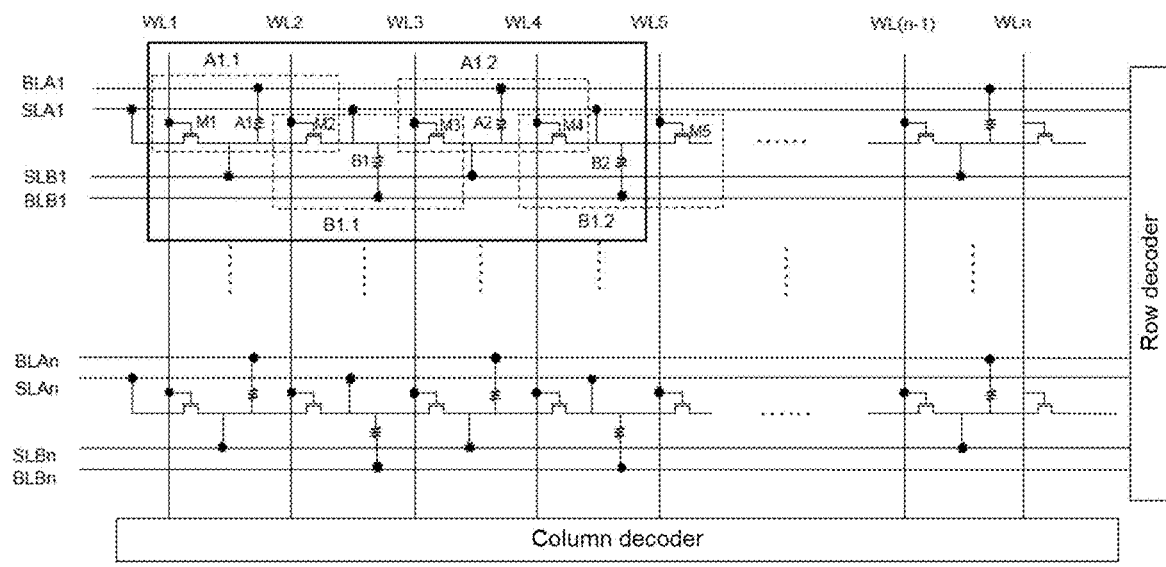
FIG. 2 is a schematic diagram of basic operation units of a storage array according to an embodiment of the present disclosure.

For example, as shown in FIG. 2, a storage unit A1 and transistors M1, M2 constitute a basic operation unit A1.1, and WL1, WL2, BLA1 and SLA1 correspond to the basic operation unit A1.1, and control a read/write operation of the basic operation unit A1.1.

Similarly, a storage unit A2 and transistors M3, M4 constitute a basic operation unit A1.2, and WL3, WL4, BLA1 and SLA1 correspond to the basic operation unit A1.2, and control a read/write operation of the basic operation unit A1.2.

A storage unit B1 and the transistors M2, M3 constitute a basic operation unit B1.1, and WL2, WL3, BLB1 and SLB1 correspond to the basic operation unit B1.1, and control a read/write operation of the basic operation unit B1.1.

A storage unit B2 and the transistors M4, M5 constitute a basic operation unit B1.2, and WL4, WL5, BLB1 and SLB1 correspond to the basic operation unit B1.2, and controls a read/write operation of the basic operation unit B1.2.

The basic operation units A1.1 and B1.1 constitute a minimum repeating unit, and the basic operation units A1.2 and B1.2 constitute a minimum repeating unit. By extending according to the structure of the minimum repeating unit, the entire storage array can be obtained.

Extending to other rows, each word line WL can span a plurality of rows, for any row:
a first bit line is connected to the other end of a storage unit in an odd-numbered column, and is denoted as BLAn;
a second bit line is connected to the other end of a storage unit in an even-numbered column, and is denoted as BLBn;
a first source line is connected to a first source/drain of a transistor in an odd-numbered column and a second source/drain of a transistor in an even-numbered column, and is denoted as SLAn.

A second source line is connected to a second source/drain of a transistor in an odd-numbered column and a first source/drain of a transistor in an even-numbered column, and is denoted as SLBn.

Any storage unit in BLAn and two adjacent WLs and SLAn constitute a basic operation unit; and any storage unit in BLBn and two adjacent WLs and SLBn constitute a basic operation unit.

According to the storage array provided in the embodiments of the present disclosure, one storage unit and two transistors adjacent thereto constitute a basic operation unit, that is to say, adjacent storage units can multiplex transistors therebetween. By multiplexing transistors, the array density of storage units can be greatly increased while keeping the power supply capacity of transistors unchanged, thereby solving the problem of low density of an existing array using transistors with a double finger structure.

In another aspect, an embodiment of the present disclosure provides an interconnection structure of a storage array, wherein the interconnection structure includes:
a plurality of active areas, wherein each active area corresponds to one row of the storage array and is used for forming sources/drains of transistors in one row;
a plurality of word lines spanning each active area, wherein each word line corresponds to one column of the storage array, and the plurality of word lines separate each active area;
storage units located at intervals between the plurality of word lines, wherein one end of a storage unit in an odd-numbered column is connected to an active area between a word line in an odd-numbered column and a word line in a subsequent even-numbered column, and one end of a storage unit in an even-numbered column is connected to an active area between a word line in an even-numbered column and a word line in a subsequent odd-numbered column;

and a first bit line, a second bit line, a first source line and a second source line located in each active area, wherein the first bit line is connected to the other end of a storage unit in an odd-numbered column;

the second bit line is connected to the other end of a storage unit in an even-numbered column;

the first source line is connected to an active area between a word line in an even-numbered column and a word line in a subsequent odd-numbered column; and the second source line is connected to an active area between a word line in an odd-numbered column and a word line in a subsequent even-numbered column.

The interconnection structure may be implemented in various manners, and examples are provided below for illustration.

Figure 3:
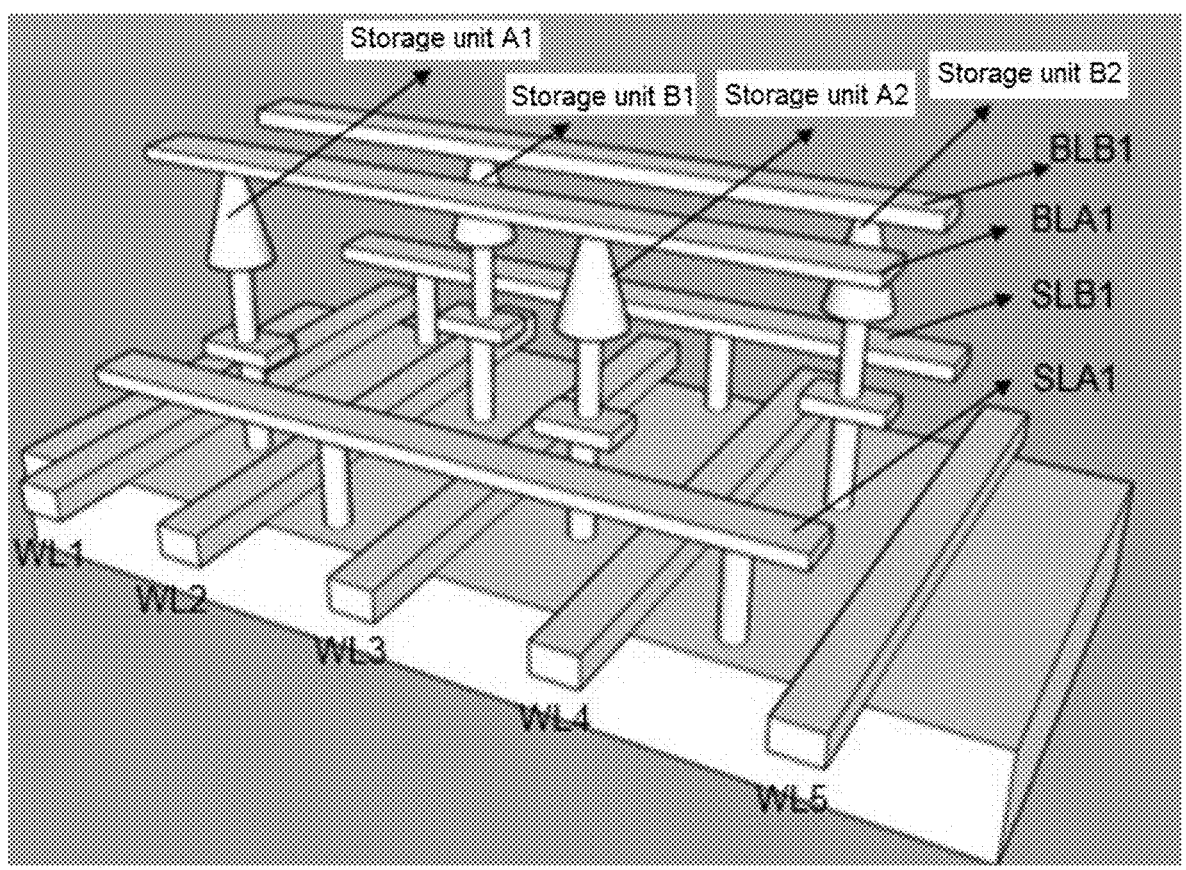
FIG. 3 is a partial elevation view of an interconnection structure of a storage array according to an embodiment of the present disclosure.

Interconnection Structure 1:

FIG. 3 shows a partial schematic diagram of an interconnection structure of a storage array according to an embodiment of the present disclosure. The interconnection structure represents an interconnection structure between two initial minimum repeating units in the first row of the storage array, that is, an interconnection structure between the basic operation units A1.1, B1.1, A1.2 and B1.2 selected in boxes in the storage array in FIG. 2.

Referring to FIG. 3, in an Active Area (AA) of the first row, a plurality of word lines separate the active area. An active area between a word line in an odd-numbered column and a word line in a subsequent even-numbered column is shared by a transistor in an odd-numbered column and a transistor in a subsequent even-numbered column, and is used for forming a second source/drain of the transistor in an odd-numbered column and a first source/drain of the transistor in an even-numbered column. An active area between a word line in an even-numbered column and a word line in a subsequent odd-numbered column is shared by a transistor in an even-numbered column and a transistor in a subsequent odd-numbered column, and is used for forming a second source/drain of the transistor in an even-numbered column and a first source/drain of the transistor in an odd-numbered column.

There are both a contact CT corresponding to a storage unit and a CT corresponding to a source line in an active area separated by the same word line. One end of a storage unit is connected to the active area through a Via and a CT corresponding to the storage unit, and the storage unit is separated by a WL in the vertical direction. The other end of a storage unit in an odd-numbered column is connected to form a first bit line BLA1, and the other end of a storage unit in an even-numbered column is connected to form a second bit line BLB1. The first source line SLA1 is connected to an active area between a word line in an even-numbered column and a word line in a subsequent odd-numbered column, and the second source line SLB1 is connected to an active area between a word line in an odd-numbered column and a word line in a subsequent even-numbered column.

Extending to other active areas, each word line may span a plurality of active areas, and different active areas are separated by shallow trench isolation (STI). By way of example, for any one active area AAn:

a first bit line is connected to the other end of a storage unit in an odd-numbered column, and is denoted as BLAn;

a second bit line is connected to the other end of a storage unit in an even-numbered column, and is denoted as BLBn;

a first source line is connected to an active area between a word line in an even-numbered column and a word line in a subsequent odd-numbered column through a VIA and a CT, and is denoted as SLAn; and a second source line is connected to an active area between a word line in an odd-numbered column and a word line in a subsequent even-numbered column through a VIA and a CT, and is denoted as SLBn.

Any storage unit in BLAn and two adjacent WLs and SLAn constitute a basic operation unit; and any storage unit in BLBn and two adjacent WLs and SLBn constitute a basic operation unit.

In the interconnection structure, the first bit line, the second bit line, the first source line and the second source line in each active area are all located above each active area, and are arranged in parallel in an extending direction of the word lines, and there is no overlapping region in a vertical direction.

Figure 4:
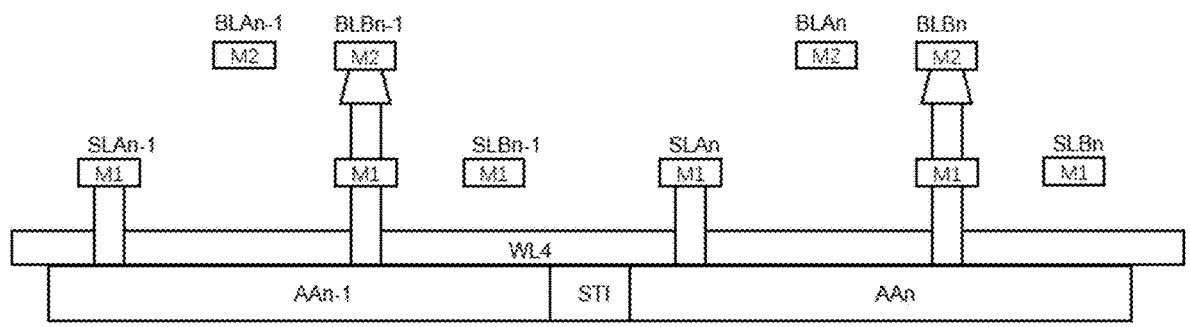
FIG. 4 is a partial sectional view of an interconnection structure of a storage array according to an embodiment of the present disclosure.
Figure 4:
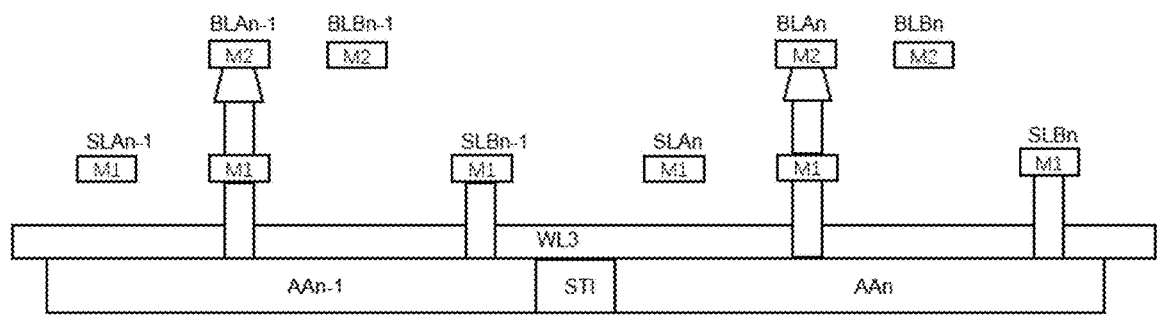

As an implementation, FIG. 4 shows a sectional view of any two adjacent active areas AAn-1 and AAn in the interconnection structure shown in FIG. 3. Referring to FIG. 4, FIG. 4(a) shows a sectional view of storage units in the fourth column in the WL extending direction, and FIG. 4(b) shows a sectional view of storage units in the third column in the WL extending direction. In an active area, the storage units are respectively led out by contacts (CT, a metal connection between an active area and a metal layer M1 is generally referred to as CT) arranged in a staggered manner, wherein a storage unit is integrated in a via (Via, a metal connection between different metal layers is generally referred to as Via, for example, a metal connection between a metal layer M1 and a metal layer M2 may be referred to as Via1, a metal connection between a metal layer M2 and a metal layer M3 may be referred to as Via2, and so on); and the storage unit may be located in Via1, and may also be located in other Via layers. The metal wiring on the Via having a storage unit corresponds to the BL, and the metal wiring on the CT without a storage unit corresponds to the SL. SL is located in a peripheral area of AA, and BL is located in a central area of AA. SL may be composed of a single layer of metal M1/M2, or may be composed of both M1 and M2. In this embodiment, SL is led out by the metal line of layer M1, and BL is led out by the metal line of layer M2.

It should be noted that the interconnection structure 1 may also be implemented in other manners. For example, the relative positions of the source line and the bit line can be changed, and the first source line and the second source line can be located in a peripheral area of each active area; alternatively, the first source line and the second source line are located in a central area of each active area; alternatively, one of the first source line and the second source line is located in a central area of each active area, and the other is located in a peripheral area of each active area. For example, the positions of the storage units can also be changed, the storage units are formed above each active area separated by word lines, and can be located on contacts and connected to the active area through the contacts corresponding to the storage units, or can be located in any layer of vias and connected to the active area through the vias and the contacts corresponding to the storage units. For example, the first source line and the second source line may include one or more layers of metal lines. The BL and the SL may be led out by the same layer of metal lines, and may also be led out by different layers of metal lines.

Figure 5:
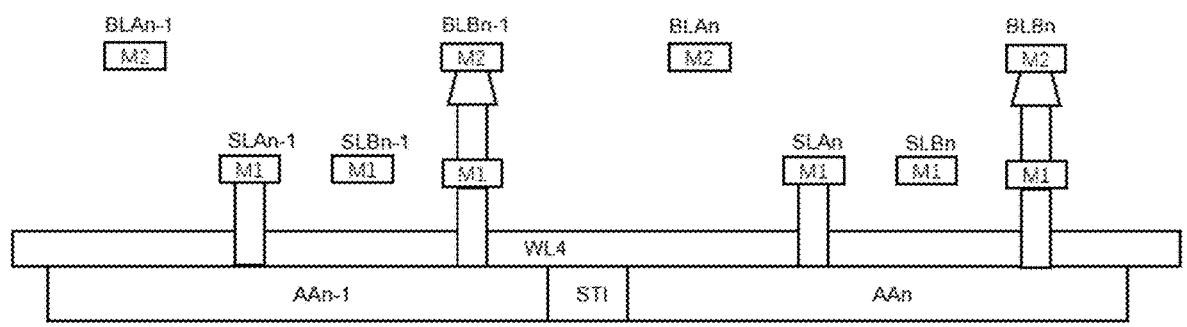
FIG. 5 is a partial sectional view of an interconnection structure of a storage array according to an embodiment of the present disclosure.
Figure 5:
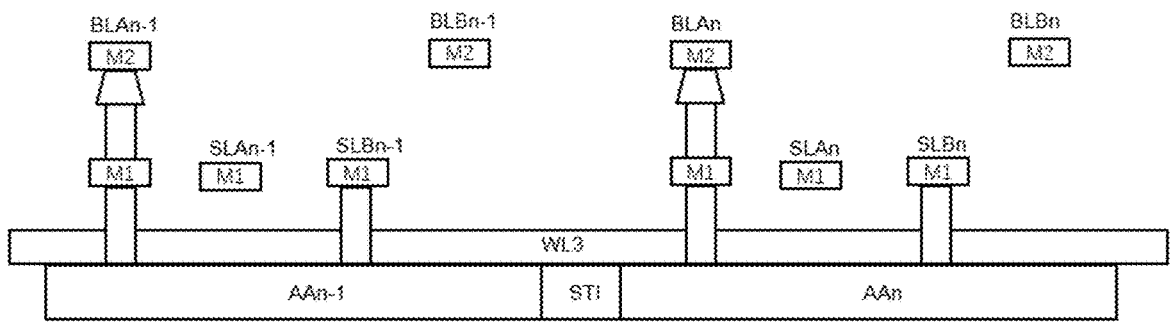
Figure 6:
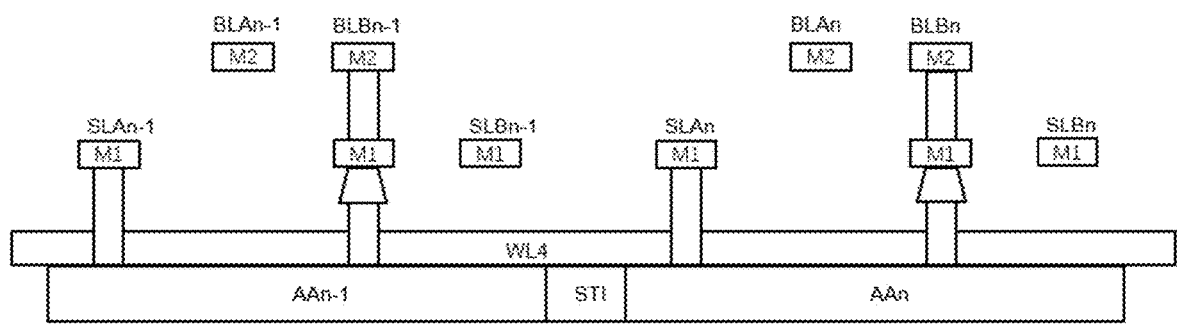
FIG. 6 is a partial sectional view of an interconnection structure of a storage array according to an embodiment of the present disclosure.
Figure 6:
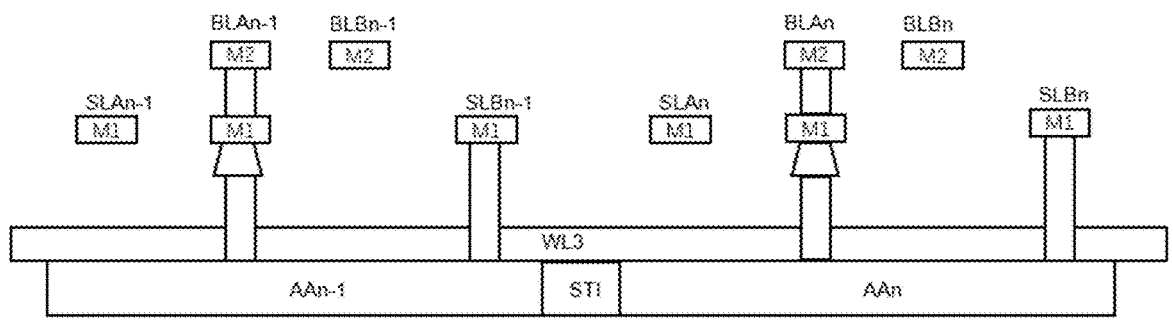
Figure 7:
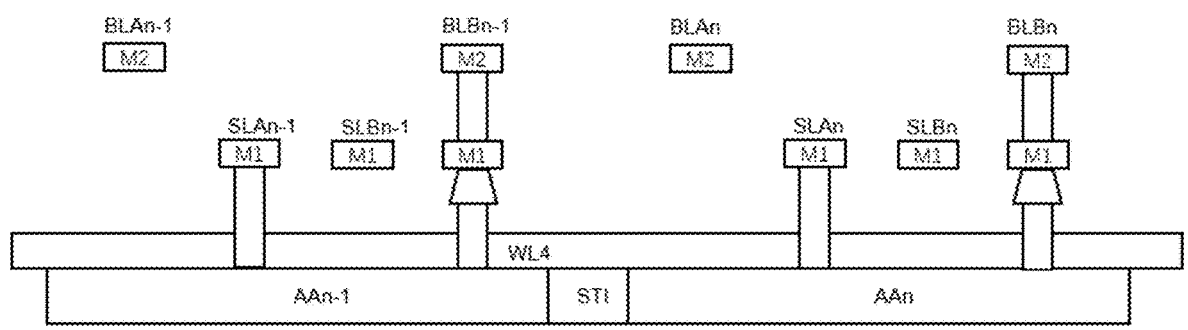
FIG. 7 is a partial sectional view of an interconnection structure of a storage array according to an embodiment of the present disclosure.
Figure 7:
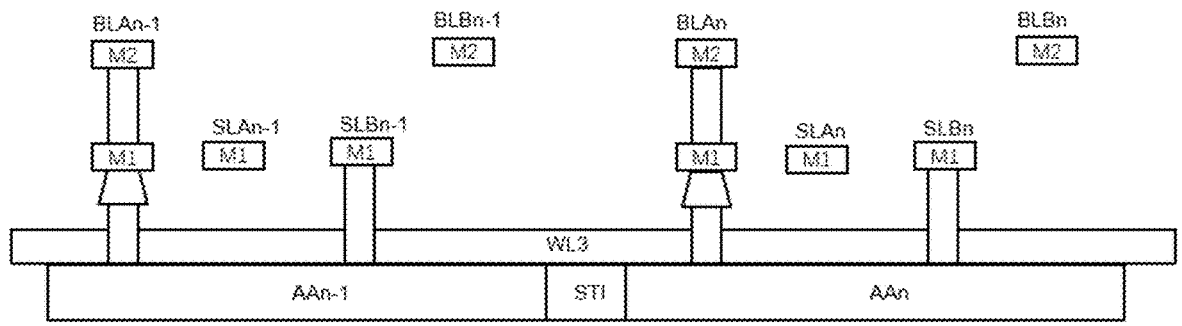

FIG. 5 to FIG. 7 show several modified structures of the interconnection structure 1.

As an implementation, referring to FIG. 5, FIG. 5(a) shows a sectional view of storage units in the fourth column in the WL extending direction, and FIG. 5(b) shows a sectional view of storage units in the third column in the WL extending direction. In an active area, the storage units are respectively led out by CTs arranged in a staggered manner, wherein a storage unit is integrated in a Via, the metal wiring on the CT and Via having a storage unit corresponds to the BL, and the metal wiring on the CT without a storage unit corresponds to the SL. Compared with FIG. 4, the difference lies in that BL is located in a peripheral area of AA, and SL is located in a central area of AA.

As an implementation, referring to FIG. 6, FIG. 6(a) shows a sectional view of storage units in the fourth column in the WL extending direction, and FIG. 6(b) shows a sectional view of storage units in the third column in the WL extending direction. In an active area, the storage units are respectively led out by CTs arranged in a staggered manner, wherein a storage unit is integrated on a CT, the metal wiring on the CT and Via having a storage unit corresponds to the BL, and the metal wiring on the CT without a storage unit corresponds to the SL. Compared with FIG. 4, the difference lies in that the storage units are located at different positions.

As an implementation, referring to FIG. 7, FIG. 7(a) shows a sectional view of storage units in the fourth column in the WL extending direction, and FIG. 7(b) shows a sectional view of storage units in the third column in the WL extending direction. Compared with FIG. 4, the positions of BL and SL are adjusted, and the positions of storage units are adjusted in FIG. 7.

In the interconnection structure of a storage array provided in the embodiments of the present disclosure, there are both CTs corresponding to a storage unit and a source line in an active area separated by the same WL, and the bit lines and the source lines in each row are divided into two groups respectively according to odd-numbered columns and even-numbered columns, which can be operated separately. The embodiments of the present disclosure can improve the density of storage units in the BL direction while ensuring that the power supply capacity is not reduced. While the area of the storage unit per unit is greatly reduced, the subsequent metal wiring process node remains unchanged, having high compatibility.

Figure 8:
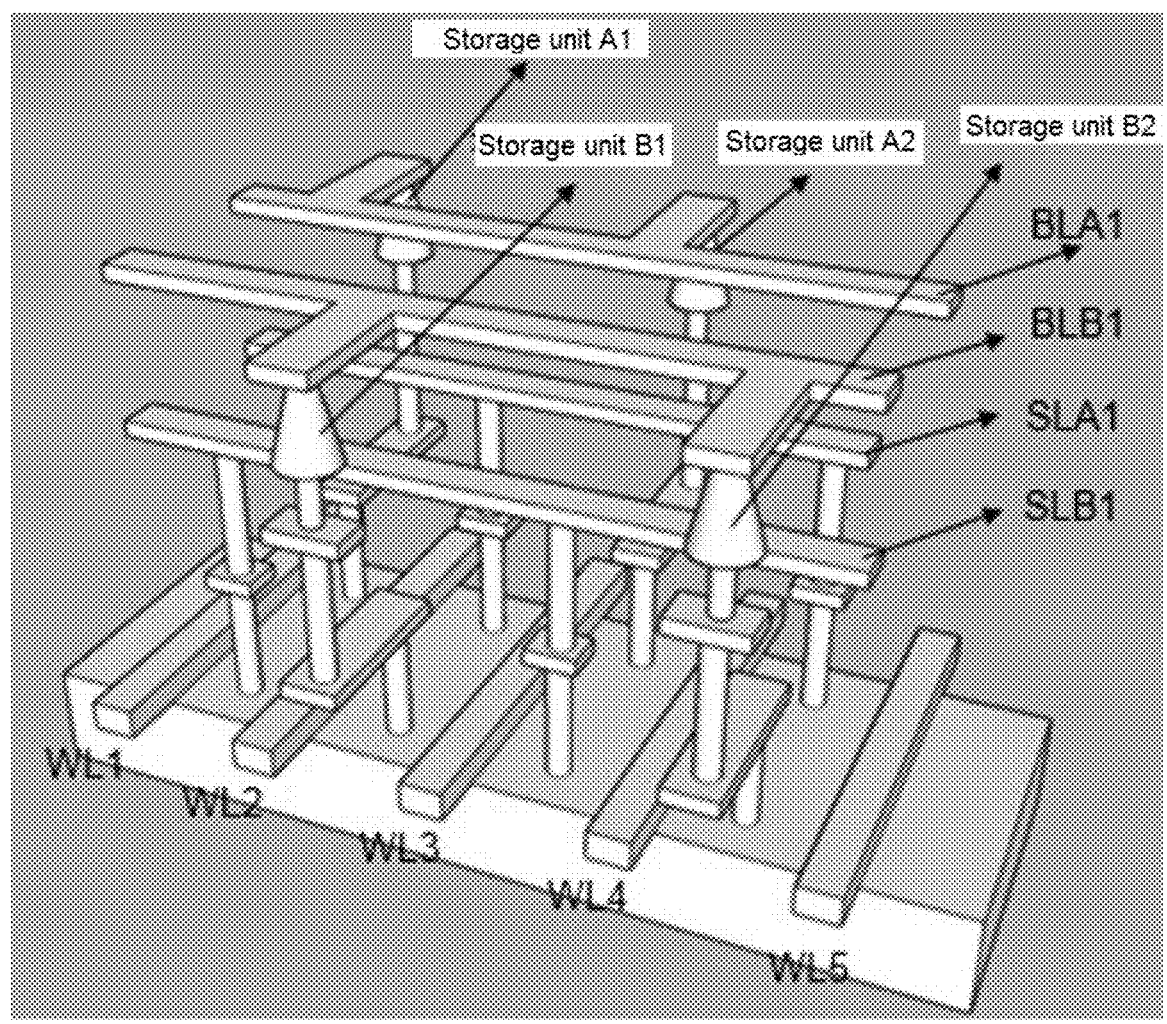
FIG. 8 is a partial elevation view of an interconnection structure of a storage array according to an embodiment of the present disclosure.

Interconnection Structure 2:

FIG. 8 shows a partial schematic diagram of an interconnection structure of a storage array according to an embodiment of the present disclosure. The interconnection structure represents an interconnection structure between two initial minimum repeating units in the first row of the storage array, that is, an interconnection structure between the basic operation units A1.1, B1.1, A1.2 and B1.2 selected in boxes in the storage array in FIG. 2.

Referring to FIG. 8, in an active area of the first row, a plurality of word lines separate the active area. An active area between a word line in an odd-numbered column and a word line in a subsequent even-numbered column is shared by a transistor in an odd-numbered column and a transistor in a subsequent even-numbered column, and is used for forming a second source/drain of the transistor in an odd-numbered column and a first source/drain of the transistor in an even-numbered column. An active area between a word line in an even-numbered column and a word line in a subsequent odd-numbered column is shared by a transistor in an even-numbered column and a transistor in a subsequent odd-numbered column, and is used for forming a second source/drain of the transistor in an even-numbered column and a first source/drain of the transistor in an odd-numbered column.

There are both a contact CT corresponding to a storage unit and a CT corresponding to a source line in an active area separated by the same word line. One end of a storage unit is connected to the active area through a Via and a CT corresponding to the storage unit, and the storage unit is separated by a WL in the vertical direction. The other end of a storage unit in an odd-numbered column is connected to form a first bit line BLA1, and the other end of a storage unit in an even-numbered column is connected to form a second bit line BLB1. The first source line SLA1 is connected to an active area between a word line in an even-numbered column and a word line in a subsequent odd-numbered column, and the second source line SLB1 is connected to an active area between a word line in an odd-numbered column and a word line in a subsequent even-numbered column.

In the interconnection structure, the first bit line and the first source line in each active area are arranged vertically, and there is an overlapping region in a vertical direction; and the second bit line and the second source line are arranged vertically, and there is an overlapping region in a vertical direction.

Figure 9:
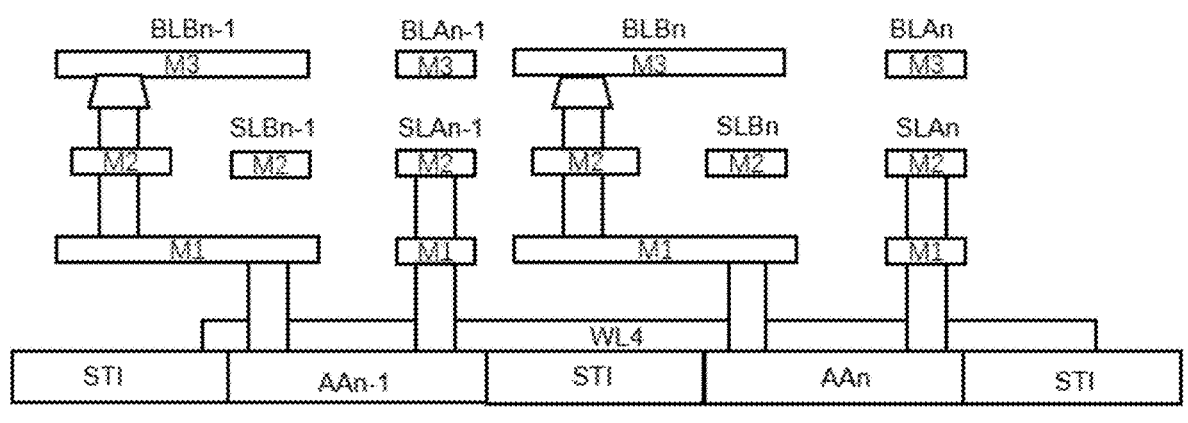
FIG. 9 is a partial sectional view of an interconnection structure of a storage array according to an embodiment of the present disclosure.
Figure 9:
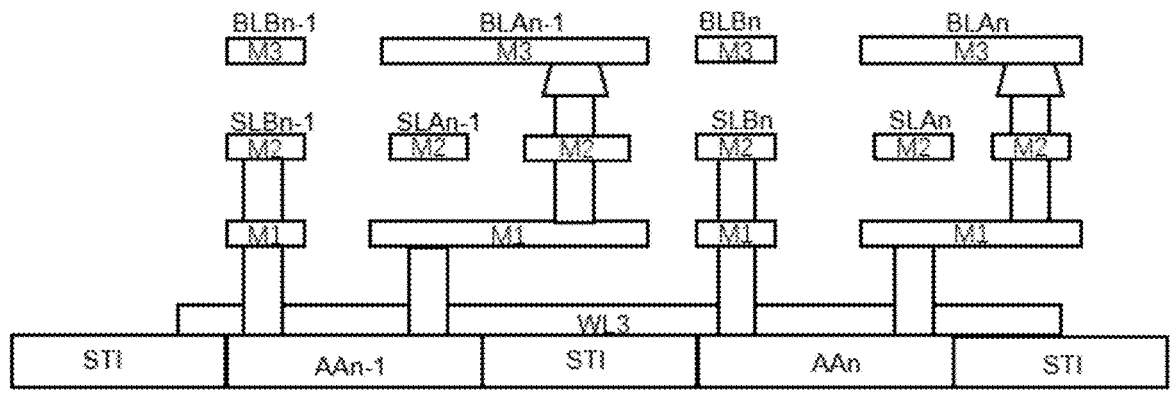

As an implementation, FIG. 9 shows a sectional view of any two adjacent active areas AAn-1 and AAn in the interconnection structure shown in FIG. 8. Referring to FIG. 9, FIG. 9(a) shows a sectional view of storage units in the fourth column in the WL extending direction, and FIG. 9(b) shows a sectional view of storage units in the third column in the WL extending direction. The metal wirings of storage units are arranged in a staggered manner above STI, and the storage units are located in Vias above the STI; and the metal wirings led out in a direction from the AA to the STI may be any metal layer or a top electrode or bottom electrode layer of the storage units.

Specifically, two rows of CTs are led out in one active area. A CT at an odd-numbered position in the BL direction on the left side is directly connected to M1 and then vertically connected to V1; and a CT at an even-numbered position in the BL direction on the right side is directly connected to M1 and then vertically connected to V1.

Accordingly, a CT at an odd-numbered position in the BL direction on the right side is led out in layer M1 to the right to an STI; a CT at an even-numbered position in the BL direction on the left side is led out in layer M1 to the left to an STI; thus, a structure in staggered arrangement is formed on the STI.

Then, the vertically led out V1 is connected in layer M2 to form an SL; M1 led out laterally to the STI is connected to V1 above the STI, and is connected to M2 above V1, M2 is connected upward to V2 and a storage unit, and the storage unit is connected upward to M3; M3 is led out laterally to be above the AA, forming two BLs.

It should be noted that the interconnection structure 2 may also be implemented in other manners. For example, the storage units may be located above the AA, and may also be led out to be above the STI by metal wirings; and the storage units may be located on CTs, or in any layer of Vias; the storage units in odd-numbered columns and the storage units in even-numbered columns may not be on the same plane, and wirings led out from above the AA to above the STI may be a metal layer, a top electrode of the storage units or a bottom electrode layer of the storage units. For example, the first source line and the second source line may include one or more layers of metal lines. The BL and the SL may be led out by the same layer of metal lines, and may also be led out by different layers of metal lines.

Figure 10:
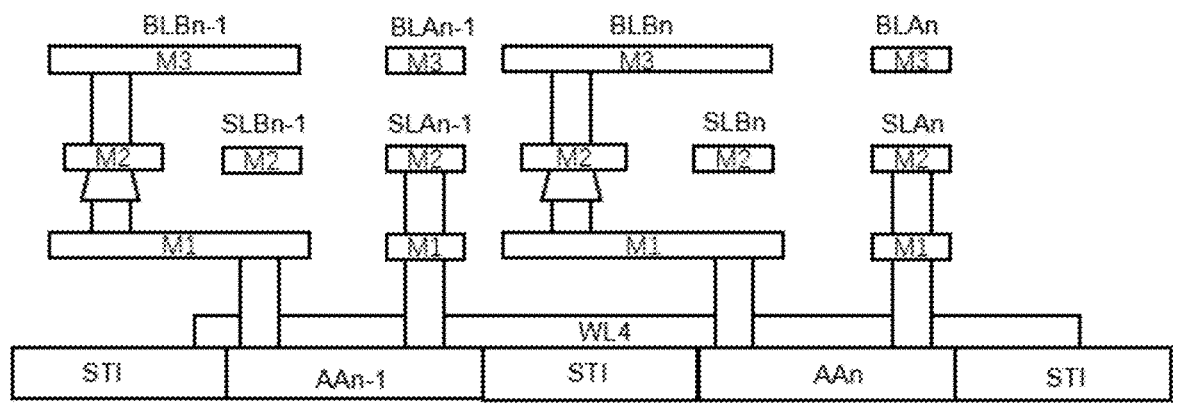
FIG. 10 is a partial sectional view of an interconnection structure of a storage array according to an embodiment of the present disclosure.
Figure 10:
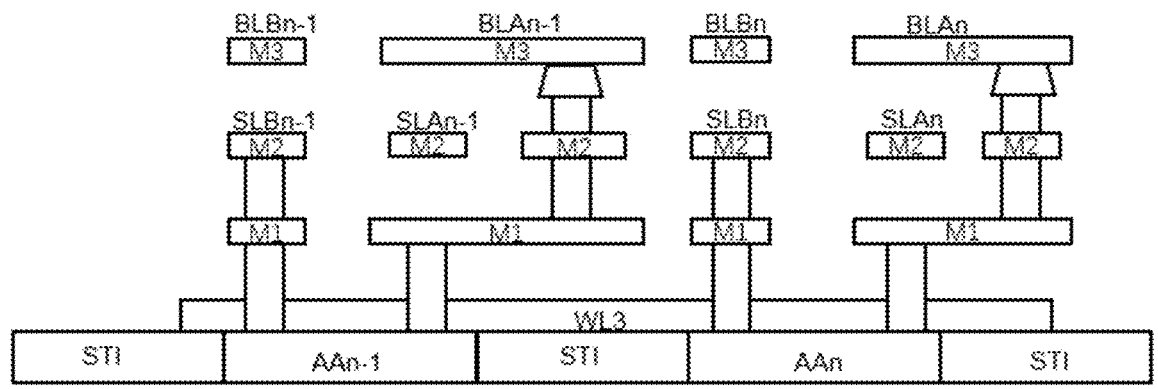
Figure 11:
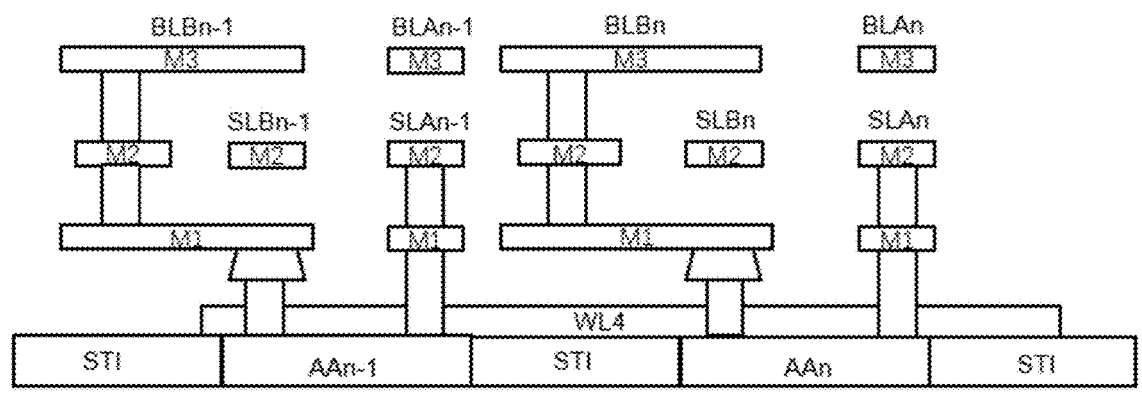
FIG. 11 is a partial sectional view of an interconnection structure of a storage array according to an embodiment of the present disclosure.
Figure 11:
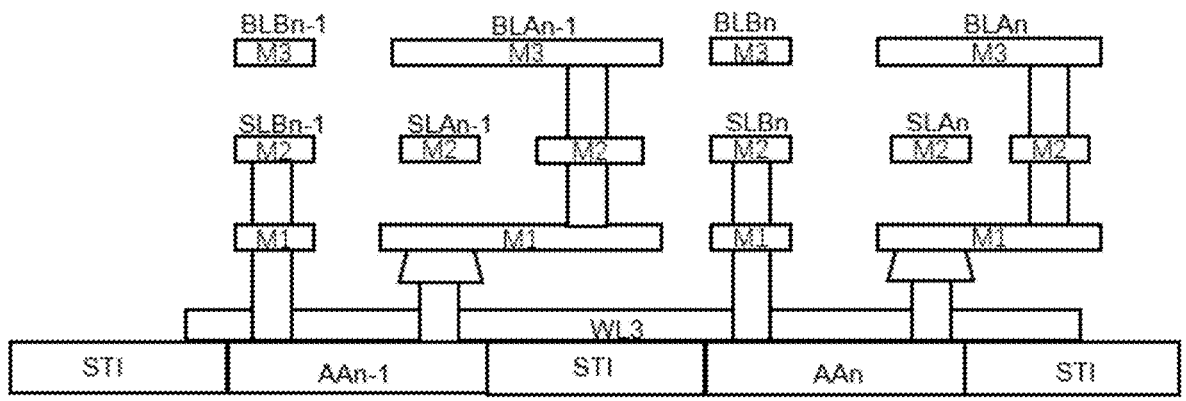
Figure 12:
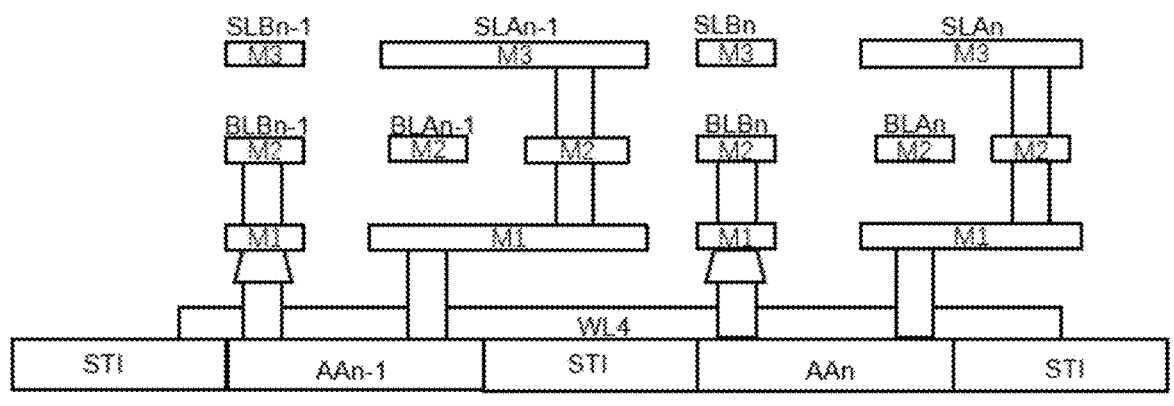
FIG. 12 is a partial sectional view of an interconnection structure of a storage array according to an embodiment of the present disclosure.
Figure 12:
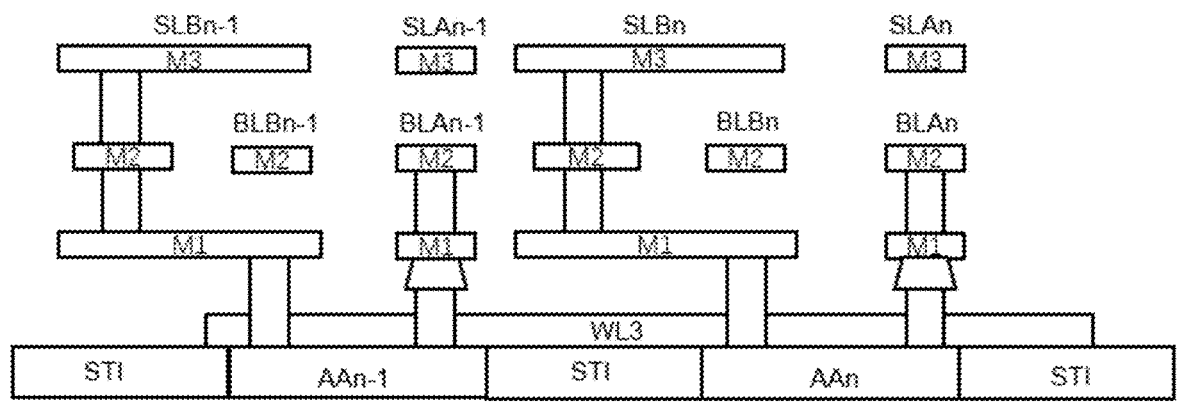

FIG. 10 to FIG. 12 show several modified structures of the interconnection structure 2.

As an implementation, referring to FIG. 10, FIG. 10(a) shows a sectional view of storage units in the fourth column in the WL extending direction, and FIG. 10(b) shows a sectional view of storage units in the third column in the WL extending direction. The metal wirings of storage units are arranged in a staggered manner above STI, and the storage units are located in Vias above the STI; and the storage units in odd-numbered columns and the storage units in even-numbered columns may not be on the same plane; the metal wirings led out in a direction from the AA to the STI may be any metal layer or a top electrode or bottom electrode layer of the storage units. Compared with FIG. 9, the difference lies in that the storage units on two corresponding BLs are between M1 and M2 and between M2 and M3 respectively.

As an implementation, referring to FIG. 11, FIG. 11(a) shows a sectional view of storage units in the fourth column in the WL extending direction, and FIG. 11(b) shows a sectional view of storage units in the third column in the WL extending direction. The storage units are located in CTs or Vias right above an AA (if the storage units are located in the Vias, the storage units will not be led out along with the wirings to be above STI); the metal wirings of the storage units are arranged in a staggered manner above the STI; the metal wirings led out in a direction from the AA to the STI may be any metal layer or a top electrode or bottom electrode layer of the storage units. Compared with FIG. 9, the difference lies in that the storage units are directly integrated on the CTs, and are not led out to be above the STI.

As an implementation, referring to FIG. 12, FIG. 12(a) shows a sectional view of storage units in the fourth column in the WL extending direction, and FIG. 12(b) shows a sectional view of storage units in the third column in the WL extending direction. The metal wirings corresponding to an SL are arranged in a staggered manner above an STI; the storage units are located in CTs or Vias above an AA. Compared with FIG. 9, the difference lies in that the metal wirings led out to be above the STI correspond to an SL. Therefore, the SL metal layer is eventually above the BL metal layer.

The interconnection structure of a storage array provided in the embodiments of the present disclosure achieves metal interconnection by means of shallow trench isolation between active areas, the wirings connected to the storage units are arranged in a staggered manner above STI between AAs or the metal wirings corresponding to source lines are arranged in a staggered manner above STI between AAs, thereby reducing the size in the WL direction, achieving the purpose of improving the density of an array.

It can be understood that, the interconnection structure 1 and the interconnection structure 2 of the storage array provided in the embodiments of the present disclosure are applicable to the storage array provided in the foregoing embodiments, and are specific physical implementations of the storage array.

In another aspect, an embodiment of the present disclosure provides a method for operating a storage array, which is applicable to the storage array provided in the foregoing embodiments. The operating method includes:

when a read/write operation is performed on a storage unit in an odd-numbered column in any row, a word line adjacent to the selected storage unit in an odd-numbered column is enabled, a control potential is applied to a first bit line and a first source line, transistors corresponding to remaining word lines are turned off, and a second bit line and a second source line are kept floating at the same time; 0 or a negative voltage is applied to bit lines and source lines in other rows or bit lines and source lines in other rows are floating, and 0 is applied to word lines;

when a read/write operation is performed on a storage unit in an even-numbered column in any row, a word line adjacent to the selected storage unit in an even-numbered column is enabled, a control potential is applied to a second bit line and a second source line, transistors corresponding to remaining word lines are turned off, and a first bit line and a first source line are kept floating at the same time; and 0 or a negative voltage is applied to bit lines and source lines in other rows or bit lines and source lines in other rows are floating, and 0 is applied to word lines.

The read/write operation is described by taking a storage unit A2 in an odd-numbered column as an example.

Figure 13:
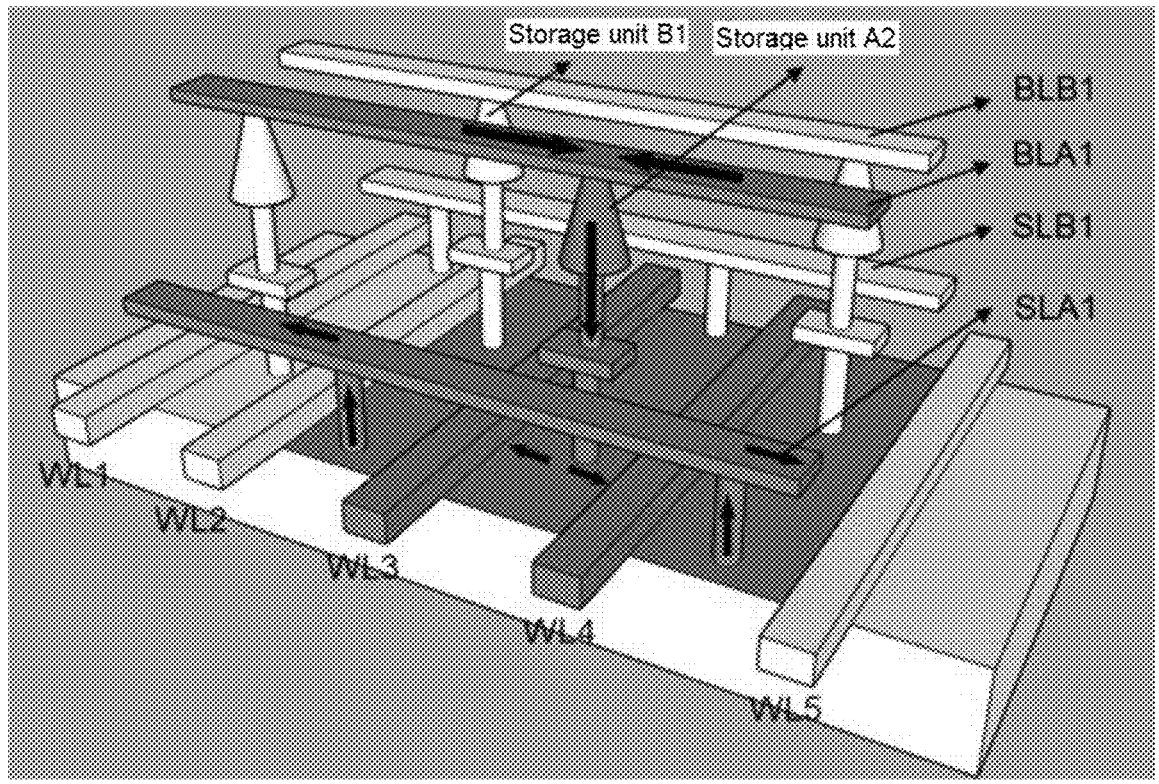
FIG. 13 is a schematic diagram of an operation of writing 0 into a storage unit in an odd-numbered column according to an embodiment of the present disclosure.

Write-0 operation: as shown in FIG. 13, a high potential is applied to BLA1, a low potential is applied to SLA1, transistors corresponding to WL3 and WL4 are turned on, BLB1 and SLB1 are floating, the current flows from BLA1 to SLA1 through the storage unit A2, 0 or a negative voltage is applied to the remaining BLs and SLs or the remaining BLs and SLs are floating, and 0 is applied to the remaining WLs.

Figure 14:
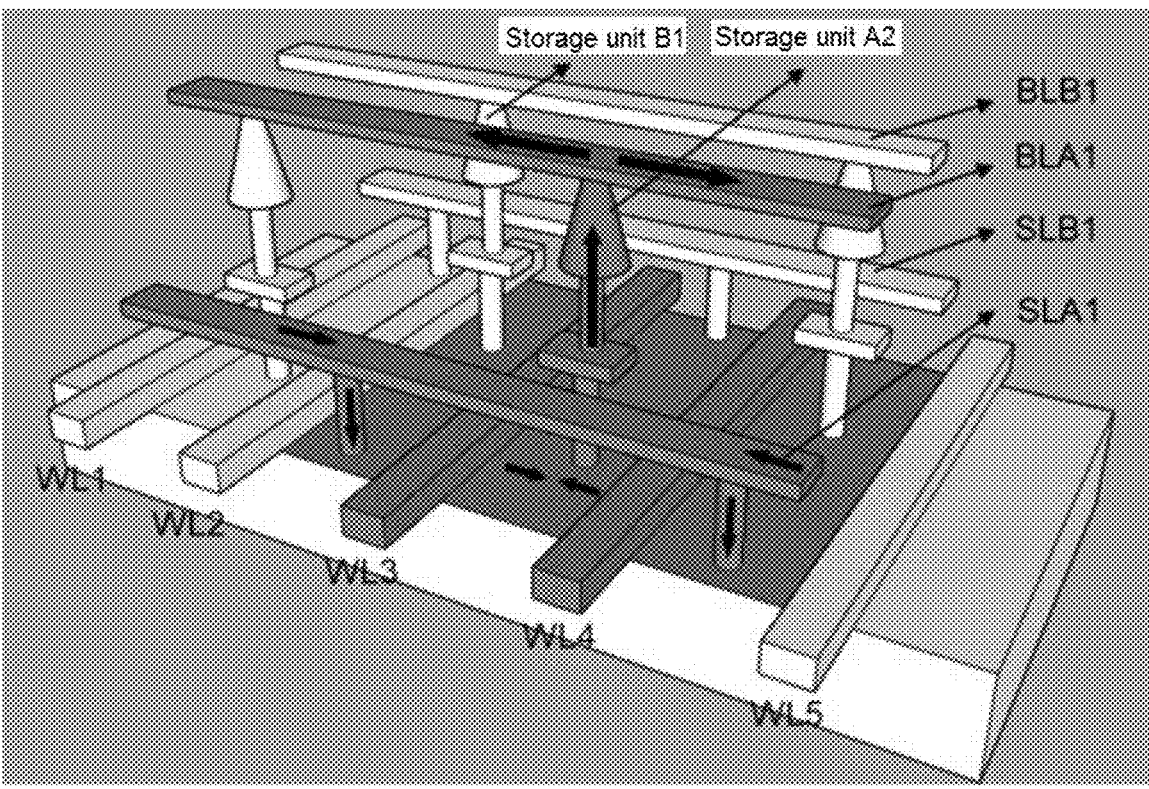
FIG. 14 is a schematic diagram of an operation of writing 1 into a storage unit in an odd-numbered column according to an embodiment of the present disclosure.

Write-1 operation: as shown in FIG. 14, a low potential is applied to BLA1, a high potential is applied to SLA1, transistors corresponding to WL3 and WL4 are turned on, BLB1 and SLB1 are floating, the current flows from SLA1 to BLA1 through the storage unit A2, 0 or a negative voltage is applied to the remaining BLs and SLs or the remaining BLs and SLs are floating, and 0 is applied to the remaining WLs.

Read operation: the specific operation circuit is the same as the write-0 operation circuit, and reference can be made to FIG. 13. A small potential is applied to BLA1, a low potential is applied to SLA1, transistors corresponding to WL3 and WL4 are turned on, BLB1 and SLB1 are floating, the current flows from BLA1 to SLA1 through the storage unit A2, 0 or a negative voltage is applied to the remaining BLs and SLs or the remaining BLs and SLs are floating, and 0 is applied to the remaining WLs.

The read/write operation is described by taking a storage unit B1 in an even-numbered column as an example.

Figure 15:
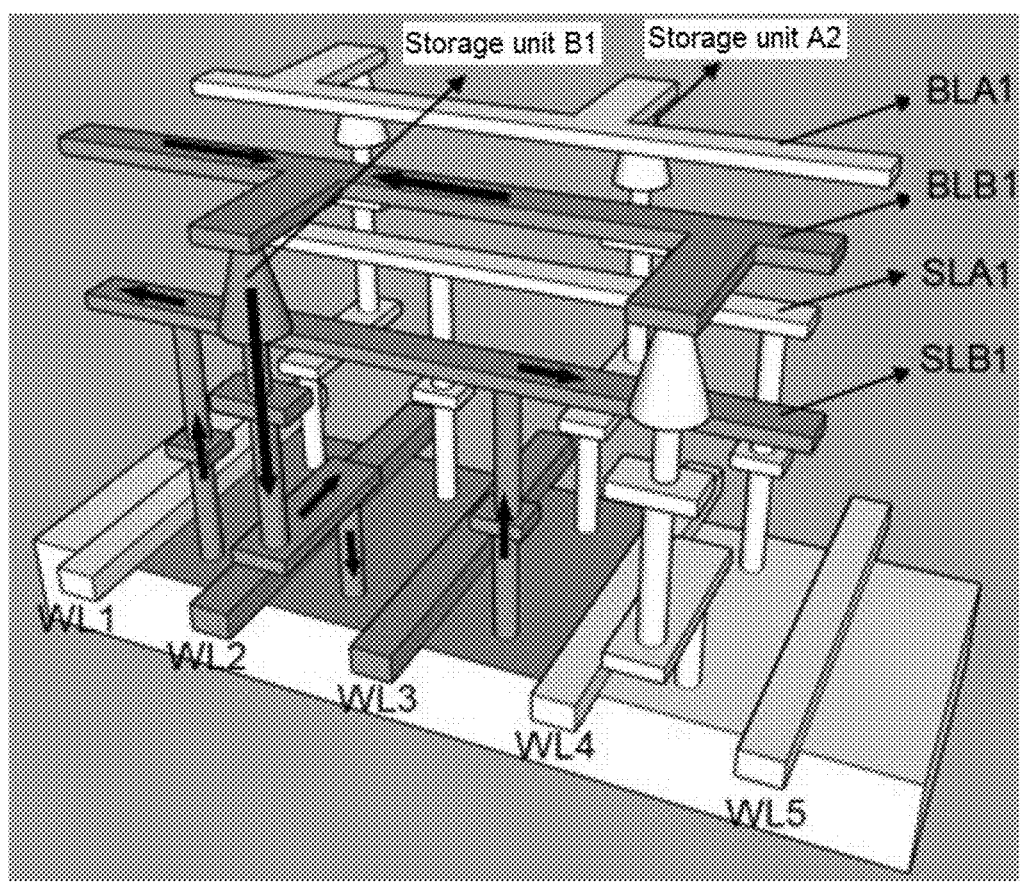
FIG. 15 is a schematic diagram of an operation of writing 0 into a storage unit in an even-numbered column according to an embodiment of the present disclosure.

Write-0 operation: as shown in FIG. 15, a high potential is applied to BLB1, a low potential is applied to SLB1, transistors corresponding to WL2 and WL3 are turned on, BLA1 and SLA1 are floating, the current flows from BLB1 to SLB1 through the storage unit B1, 0 or a negative voltage is applied to the remaining BLs and SLs or the remaining BLs and SLs are floating, and 0 is applied to the remaining WLs.

Figure 16:
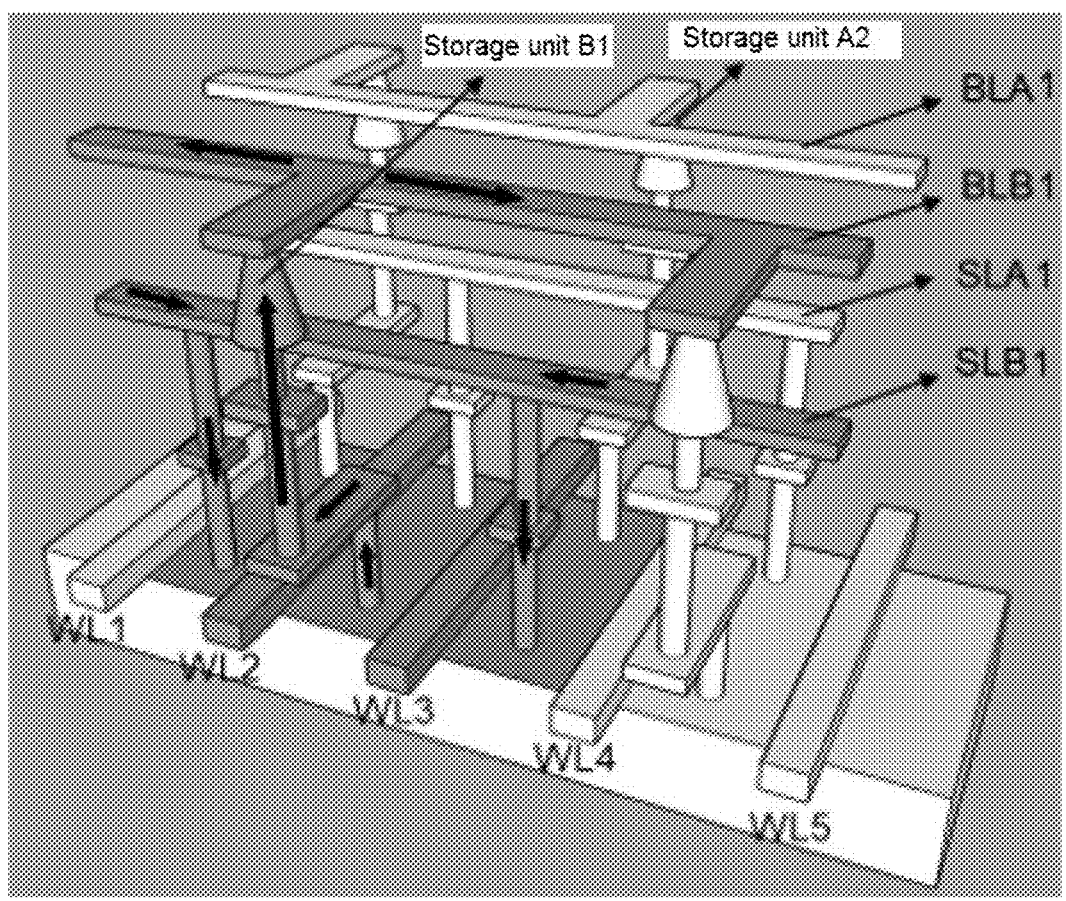
FIG. 16 is a schematic diagram of an operation of writing 1 into a storage unit in an even-numbered column according to an embodiment of the present disclosure.

Write-1 operation: as shown in FIG. 16, a low potential is applied to BLB1, a high potential is applied to SLB1, transistors corresponding to WL2 and WL3 are turned on, BLA1 and SLA1 are floating, the current flows from SLB1 to BLB1 through the storage unit B1, 0 or a negative voltage is applied to the remaining BLs and SLs or the remaining BLs and SLs are floating, and 0 is applied to the remaining WLs.

Read operation: the specific operation circuit is the same as the write-0 operation circuit, and reference can be made to FIG. 15. A small potential is applied to BLB1, a low potential is applied to SLB1, transistors corresponding to WL2 and WL3 are turned on, BLA1 and SLA1 are floating, the current flows from BLB1 to SLB1 through the storage unit B1, 0 or a negative voltage is applied to the remaining BLs and SLs or the remaining BLs and SLs are floating, and 0 is applied to the remaining WLs.

The foregoing descriptions are merely specific embodiments of the present disclosure, and are not intended to limit the scope of protection of the present disclosure. Any variation or replacement readily occurred to a person skilled in the art within the technical scope disclosed in the present disclosure shall belong to the scope of protection of the present disclosure. Therefore, the scope of protection of the present disclosure should be subject to the scope of protection of the claims.

What is claimed is:

1. A storage array, comprising:
    a plurality of bit lines, two bit lines being arranged in one row, and comprising a first bit line and a second bit line;
    a plurality of source lines, two source lines being arranged in one row, and comprising a first source line and a second source line; and
    storage units and transistors located in each column and each row, each transistor having a first source/drain and a second source/drain;
    wherein for any row of the storage array, there are the following connection relationships:
    a storage unit in an odd-numbered column has one end connected to the first bit line, and the other end connected to the second source line;
    the first source/drain of a transistor in an odd-numbered column is connected to the first source line;
    the second source/drain of a transistor in an odd-numbered column is connected to the second source line;
    a storage unit in an even-numbered column has one end connected to the second bit line, and the other end connected to the first source line;
    the first source/drain of a transistor in an even-numbered column is connected to the second source line; and
    the second source/drain of a transistor in an even-numbered column is connected to the first source line.

2. The storage array according to claim 1, wherein the storage array further comprises a plurality of word lines, and gates of the transistors in each column are connected to a corresponding word line.

3. The storage array according to claim 1, wherein the storage unit is any type of storage unit among MRAM, PCRAM, RRAM and FRAM.

4. A method for operating a storage array, applicable to the storage array according to claim 1, wherein the method comprises:
    when a read/write operation is performed on a storage unit in an odd-numbered column in any row, enabling a word line adjacent to the selected storage unit in an odd-numbered column, applying a control potential to a first bit line and a first source line, turning off transistors corresponding to remaining word lines, and keeping a second bit line and a second source line floating at the same time; applying 0 or a negative voltage to bit lines and source lines in other rows or keeping bit lines and source lines in other rows floating, and applying 0 to word lines;
    when a read/write operation is performed on a storage unit in an even-numbered column in any row, enabling a word line adjacent to the selected storage unit in an even-numbered column, applying a control potential to a second bit line and a second source line, turning off transistors corresponding to remaining word lines, and keeping a first bit line and a first source line floating at the same time; and applying 0 or a negative voltage to bit lines and source lines in other rows or keeping bit lines and source lines in other rows floating, and applying 0 to word lines.

5. An interconnection structure of a storage array, comprising:
    a plurality of active areas, wherein each active area corresponds to one row of the storage array and is used for forming sources/drains of transistors in one row;
    a plurality of word lines spanning each active area, wherein each word line corresponds to one column of the storage array, and the plurality of word lines separate each active area;
    storage units located at intervals between the plurality of word lines, wherein one end of a storage unit in an odd-numbered column is connected to an active area between a word line in an odd-numbered column and a word line in a subsequent even-numbered column, and one end of a storage unit in an even-numbered column is connected to an active area between a word line in an even-numbered column and a word line in a subsequent odd-numbered column;
    and a first bit line, a second bit line, a first source line and a second source line located in each active area,
    wherein the first bit line is connected to the other end of a storage unit in an odd-numbered column;
    the second bit line is connected to the other end of a storage unit in an even-numbered column;
    the first source line is connected to an active area between a word line in an even-numbered column and a word line in a subsequent odd-numbered column; and
    the second source line is connected to an active area between a word line in an odd-numbered column and a word line in a subsequent even-numbered column.

6. The interconnection structure of a storage array according to claim 5, wherein the first bit line, the second bit line, the first source line and the second source line are all located above each active area, and are arranged in parallel in an extending direction of the word lines, and there is no overlapping region in a vertical direction.

7. The interconnection structure of a storage array according to claim 6, wherein the first source line and the second source line are located in a peripheral area of each active area;
    alternatively, the first source line and the second source line are located in a central area of each active area;
    alternatively, one of the first source line and the second source line is located in a central area of each active area, and the other is located in a peripheral area of each active area.

8. The interconnection structure of a storage array according to claim 6, wherein
    the storage units are located above each active area; and
    the storage units are located on contacts, or in any layer of vias.

9. The interconnection structure of a storage array according to claim 6, wherein the first source line and the second source line comprise one or more layers of metal lines.

10. The interconnection structure of a storage array according to claim 5, wherein the first bit line and the first source line are arranged vertically, and there is an overlapping region in a vertical direction; and the second bit line and the second source line are arranged vertically, and there is an overlapping region in a vertical direction.

11. The interconnection structure of a storage array according to claim 10, wherein
the first bit line is located above the first source line, the first bit line is led out to be above a shallow trench isolation between the active areas by means of staggered arrangement of metal wirings, the second bit line is located above the second source line, and the second bit line is led out to be above a shallow trench isolation between the active areas by means of staggered arrangement of metal wirings;
alternatively, the first source line is located above the first bit line, the first source line is led out to be above a shallow trench isolation between the active areas by means of staggered arrangement of metal wirings, the second source line is located above the second bit line, and the second source line is led out to be above a shallow trench isolation between the active areas by means of staggered arrangement of metal wirings.

12. The interconnection structure of a storage array according to claim 10, wherein
the storage units are located above each active area, or are led out by metal wirings to be above a shallow trench isolation between the active areas;
the storage units are located on contacts, or in any layer of vias; and
the storage units in odd-numbered columns and the storage units in even-numbered columns are located on the same plane, or located on different planes.

13. The interconnection structure of a storage array according to claim 10, wherein the first source line and the second source line comprise one or more layers of metal lines.

* * * * *